(12) United States Patent
Wanke et al.

(10) Patent No.: US 7,420,225 B1
(45) Date of Patent: *Sep. 2, 2008

(54) DIRECT DETECTOR FOR TERAHERTZ RADIATION

(75) Inventors: Michael C. Wanke, Albuquerque, NM (US); Mark Lee, Albuquerque, NM (US); Eric A. Shaner, Albuquerque, NM (US); S. James Allen, Santa Barbara, CA (US)

(73) Assignee: Sandia Corporation, Albuquerque, NM (US)

( * ) Notice: Subject to any disclaimer, the term of this patent is extended or adjusted under 35 U.S.C. 154(b) by 400 days.

This patent is subject to a terminal disclaimer.

(21) Appl. No.: 11/290,090

(22) Filed: Nov. 30, 2005

(51) Int. Cl.
- H01L 31/0328 (2006.01)
- H01L 31/0336 (2006.01)
- H01L 31/072 (2006.01)
- H01L 31/109 (2006.01)
- H01L 29/06 (2006.01)

(52) U.S. Cl. .......................... 257/192; 257/19; 257/184; 257/187

(58) Field of Classification Search .................. 257/184, 257/192, 19, 187
See application file for complete search history.

(56) References Cited

U.S. PATENT DOCUMENTS 4,821,093 A * 4/1989 Iafrate et al. ................. 257/194

OTHER PUBLICATIONS

Wanke, Michael, Terahertz Radiation Mixer, Apr. 25, 2005.*
X. G. Peralta, *Terahertz photoconductivity and plasmon modes in double-quantum-well field-effect transistors*, Applied Physics Letter, vol. 81, No. 9, Aug. 26, 2002, 1627-1629.
Mark Lee, *Millimeter wave mixing using plasmon and bolometric response in a double-quantum-well field-effect transistor*, Applied Physics Letters, vol. 86, 033501-1-033501-3 (2005).
E. A. Shaner, *"Single-quantum-well grating-grated terahertz plasmon detectors,"* Applied Physics Letters, vol. 87, 193507-1-193507-3.
Taiichi Otsuji, *"Terahertz plasma wave resonance of two-dimensional electrons in InGaP/InGaAs/GaAs high-electron-mobility transistors,"* Applied Physics Letters, vol. 85, No. 11, Sep. 13, 2004, 2119-2121.

(Continued)

*Primary Examiner*—Chuong A. Luu
(74) *Attorney, Agent, or Firm*—Kevin W. Bieg

(57) ABSTRACT

A direct detector for terahertz radiation comprises a grating-gated field-effect transistor with one or more quantum wells that provide a two-dimensional electron gas in the channel region. The grating gate can be a split-grating gate having at least one finger that can be individually biased. Biasing an individual finger of the split-grating gate to near pinch-off greatly increases the detector's resonant response magnitude over prior QW FET detectors while maintaining frequency selectivity. The split-grating-gated QW FET shows a tunable resonant plasmon response to FIR radiation that makes possible an electrically sweepable spectrometer-on-a-chip with no moving mechanical optical parts. Further, the narrow spectral response and signal-to-noise are adequate for use of the split-grating-gated QW FET in a passive, multispectral terahertz imaging system. The detector can be operated in a photoconductive or a photovoltaic mode. Other embodiments include uniform front and back gates to independently vary the carrier densities in the channel region, a thinned substrate to increase bolometric responsivity, and a resistive shunt to connect the fingers of the grating gate in parallel and provide a uniform gate-channel voltage along the length of the channel to increase the responsivity and improve the spectral resolution.

40 Claims, 10 Drawing Sheets

OTHER PUBLICATIONS

W. Knap, *Resonant detection of subterahertz and terahertz radiation by plasma waves in submicron field-effect transistors*, Applied Physics Leters, vol. 81, No. 24, Dec. 9, 2002, 4637-4639.

Niu Jin, *High Sensitivity Si-Based Backward Diodes for Zero-Based Square-Law Detection and the Effect of post-Growth Annealing on Performance*, IEEE Electron Device Letters, vol. 26, No. 8, Aug. 2005, 575-578.

U.S. Appl. No. 11/113,635, filed Apr. 25, 2005, Michael C. Wanke, et al.

* cited by examiner

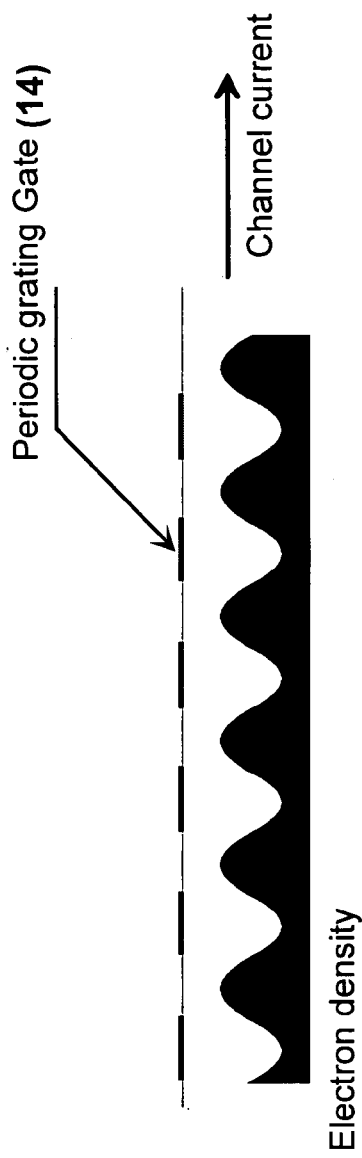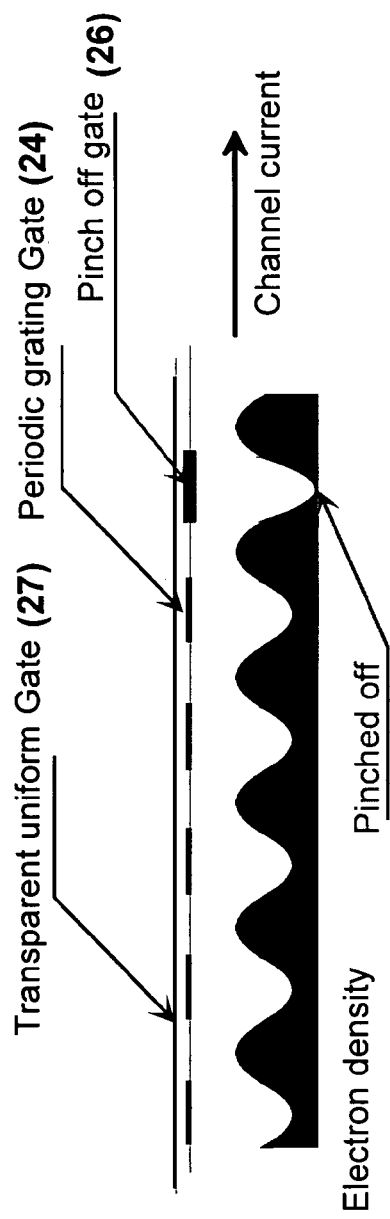

DIRECT DETECTOR FOR TERAHERTZ RADIATION

STATEMENT OF GOVERNMENT INTEREST

This invention was made with Government support under contract no. DE-AC04-94AL85000 awarded by the U.S. Department of Energy to Sandia Corporation. The Government has certain rights in the invention.

CROSS-REFERENCE TO RELATED APPLICATION

This application is related to U.S. application Ser. No. 11/113,635, filed Apr. 25, 2005, now U.S. Pat. No. 7,376,406 which is incorporated herein by reference.

FIELD OF THE INVENTION

The present invention relates to a direct detector for terahertz radiation and, in particular, to a grating-gated field-effect transistor that is frequency tunable and has high sensitivity and responsivity to terahertz radiation.

BACKGROUND OF THE INVENTION

Terahertz technologies utilize electromagnetic radiation generally in the frequency range between 100 GHz and 10 THz (i.e, wavelengths of 3 mm to 30 μm, energies of 0.4 to 40 meV, or equivalent blackbody radiation temperatures of 5° K to 500° K). Many non-metallic materials that are visually opaque are partially transparent or exhibit molecular resonances in the terahertz region. In particular, water vapor and other small polar molecules have very strong rotational absorptions at terahertz frequencies. Therefore, terahertz technologies have many potential applications in diverse fields, including molecular spectroscopy, space and atmospheric sciences, plasma physics, biology, medical imaging, remote sensing, and communications.

Historically, there has been much interest in terahertz technologies for high-resolution (i.e., high Q) spectroscopy and remote sensing for space, planetary, and Earth science. For example, much of the interstellar medium radiates in the terahertz region, somewhat above the cosmic microwave background, enabling terahertz measurements to probe star formation and the early universe. Planetary atmospheres have background temperatures of tens to several hundred degrees Kelvin, enabling terahertz observation of extraterrestrial atmospheric conditions. Furthermore, thermal emission lines in the terahertz region from gases in the Earth's stratosphere and upper troposphere provide important indicators of ozone destruction, global warming, and pollution.

However, beyond basic science, applications in the terahertz region are relatively undeveloped. Much progress is still required to provide field-deployable terahertz systems, especially for military, anti-terror, and biomedical imaging applications. Terahertz applications remain relatively undeveloped because the terahertz region lies between the traditional microwave and optical regions of the electromagnetic spectrum, where electronic or photonic technologies have been developed for these purposes. Terahertz applications have been hampered due to the historically poor performance of terahertz components lying in the "technological gap" between these traditional electronic and photonic domains.

Consequently, the generation and detection of electromagnetic fields at terahertz frequencies has been challenging. The weak radiation output from passive (i.e., thermal or backlit by the sun) and active terahertz sources, the low photon energies of terahertz radiation, and high atmospheric attenuation due to molecular absorption (e.g., water vapor) frequently results in a weak received terahertz signal that may be difficult to distinguish from noise. Furthermore, detection of this weak terahertz signal can be difficult.

Current terahertz detectors include both direct and heterodyne detectors. Direct detectors generally directly convert the received power to a voltage or current that is proportional to the incoming power. They are characterized by responsivity (the ratio of the voltage output signal divided by the input signal power, in V/W) and noise-equivalent-power (NEP, the input signal power to the detector required to achieve a signal-to-noise ratio of unity after detection, in $W/Hz^{1/2}$). A common direct detector uses antenna coupling to a small area Schottky diode that responds directly to the THz electric field. Another direct detector is the conventional bolometer that consists of a radiation absorbing material that is coupled to a sensitive temperature-dependent resistor. For shorter wavelengths (i.e., frequencies above 1 THz), direct detectors generally have good responsivity and are sensitive to a broad band of frequencies. However, they are also sensitive to incoherent background noise and interference. Finally, direct directors are typically very slow, with 1 to 10 ms response times required to obtain an adequate signal-to-noise. Therefore, direct detectors have been used mainly for wideband applications, such as thermal imaging.

There has been an especially strong need for a selective and tunable narrowband detector for spectrum analysis and imaging of the far-infrared (FIR) region of the electromagnetic spectrum (i.e., between 0.1 to 10 THz in frequency). The FIR region contains the spectral signatures of many molecules and materials in vapor and solid phases, ranging from simple diatomic chemicals to complex macromolecules of biological relevance. These signatures arise from molecular resonances that are predominately rotational or hybrid rotational-vibrational modes determined by the molecule's moment-of-inertia. The resulting FIR spectra are far better for molecular discrimination than spectroscopy based simply on mass. In addition, molecular resonance absorption and emission cross-sections in the FIR are generally much larger than at microwave or near-infrared, providing much better sensitivity to relatively small concentrations. Because of this high sensitivity and very high specificity, FIR detectors have enormous potential for chemical and biological sensing. The reliable detection of chemical and biological warfare agents and possible terror agents, such as toxic industrial chemicals, is a current national priority.

Another highly desirable application of terahertz technology is to do imaging of objects at useful standoff distances in real time for object or pattern recognition. Because terahertz irradiation does not involve the health and safety issues of ionizing radiation, such as are a concern with X-ray imaging, applications of terahertz technologies may include noninvasive tomographic imaging or spectroscopic characterization of living materials. Because terahertz radiation is nondestructive and can penetrate non-metallic and non-polarizing external coverings (e.g., clothing, semiconductors, plastics, packaging materials), the technology may be useful in security screening for hidden explosives and concealed weapons. Multispectral, passive FIR imaging is especially desirable for these imaging applications. While imaging can be performed at a single frequency, FIR image contrast between multiple frequencies can provide more information for improved identification.

Existing direct detectors usually respond to total absorbed radiation power, not frequency, and hence require mechanical motion of external optics to generate spectral information. Heterodyne mixers are also used in generating spectral information, but these are tunable only within a narrow range about a specific local oscillator (LO) frequency, and there are very few practical LO sources above about 0.5 THz. The FIR analog of a compact, solid-state microwave or optical spectrum analyzer that continuously covers a broad frequency range with reasonable speed does not yet exist.

Recently, the direct detection of terahertz radiation by two-dimensional (2D) plasma waves has been demonstrated in a double-quantum-well (DQW) field-effect transistor (FET) with a periodic grating gate. See X. G. Peralta et al., *Appl. Phys. Lett.* 81, 1627 (2002), which is incorporated herein by reference. Coherent charge density oscillations (plasmons) in a high-mobility two-dimensional electron gas (2DEG) can be exploited to circumvent ordinary electronic limits on maximum operating frequency in conventional solid state devices based on electron drift. As a result, the response of the DQW FET can be fast. Also, typical 2DEG densities from $10^{10}$ to $10^{12}$ cm$^{-2}$ and device features of 1-10 μm yield plasmon frequencies in the 100 GHz-1 THz range, making plasmon devices attractive for terahertz applications. Furthermore, the ability to electrically tune the 2DEG charge density and hence the plasmon resonance via a gate voltage in the DQW FET enables the detection of specific, user-selected terahertz frequencies.

In FIG. 1 is shown the prior DQW FET 10 of Peralta et al. The DQW FET 10 was fabricated from a modulation doped GaAs/AlGaAs DQW heterostructure grown on a semi-insulating GaAs substrate 11 by molecular beam epitaxy. The two GaAs quantum wells (QWs) 12 and 13 were 20 nm wide and separated by a 7 nm AlGaAs barrier. The nominal electron densities in the QWs 12 and 13 were about $2\times10^{11}$ cm$^2$. The electron mobility at 4.2° K was about $1.7\times10^6$ cm$^2$/Vs. The upper QW 12 was buried 404 nm below the surface of the device. A 2 mm×2 mm mesa was defined by chemical etching and ohmic contacts to both QWs 12 and 13 were formed by evaporating and annealing NiAuGe over the edge and side of the mesa forming the source S and the drain D. A 70 nm thick TiAu grating gate 14 (with no metallization between the grating fingers) was evaporated on the surface of the device with the fingers of the grating parallel to the ohmic contacts, perpendicular to the current flow. The grating period was 4 μm.

As shown in FIG. 2a, the grating spatially modulates the electron density in the QWs 12 and 13 under the metallized part of the gate 14 when a bias voltage $V_g$ is applied to the grating gate, selects wave vectors of the excited plasmon, and produces both normal and transverse THz electric fields. The grating period as well as the channel electron density, under the grating fingers, determine the resonance frequency of the 2D plasma oscillations. THz radiation 15 at frequency f incident on a 2D electron gas of sheet density n will excite plasmon modes when $f=f_p$, according to the dispersion relation $$f_p = \frac{1}{2\pi}\left(\frac{e^2 n_j k_j}{2\varepsilon\varepsilon_0 m^*}\right)^{\frac{1}{2}}$$

where $f_p$ is the resonance frequency, e is the electron charge, $k_j$ is the plasmon wavevector, m* is the electron effective mass, and $\varepsilon\varepsilon_0$ is the dielectric constant of the semiconductor. In a grating-gated QW FET, n is proportional to $(V_g-V_0)$ where $V_0$ is the pinch-off voltage. Therefore, $f_p$ is continuously tunable via the grating gate voltage $V_g$, while k has discrete values set by the gate grating period d: $k_j=2\pi j/d$, where j=1, 2, 3, . . . is the harmonic mode index.

Prior tuned incoherent direct detectors and related heterodyne mixers based on grating-gated QW FETs have shortcomings for FIR spectroscopy. The DQW FET of Peralta et al. showed low response when $V_g$ was biased on a plasmon resonance, but a steep rise in responsivity, with a concomitant loss of frequency selectivity, was observed for $V_g$ close to $V_0$. Therefore, although the prior DQW FET is fast, it has a low responsivity when operated in the frequency selective mode and loses tunability near pinch-off. Recently, a fast, solid-state heterodyne mixer has been developed based on the grating-gated QW FET. However, as noted previously, heterodyne mixers are tunable only within a narrow range about the LO, and currently there are few practical LO sources that operate above about 0.5 THz. Further, the NEP of the heterodyne mixer may not be adequate for passive, incoherent terahertz imaging. See U.S. application Ser. No. 11/113,635 to Wanke et al.; and M. Lee et al., "Millimeter wave mixing using plasmon and bolometric response in a double-quantum-well field-effect transistor," *Appl. Phys. Lett.* 86, 033501 (2005), which are incorporated herein by reference.

Therefore, a need remains for a direct detector that is continuously tunable over a broad terahertz frequency range and has adequate responsivity and sensitivity for spectroscopy and imaging. The detector should preferably be a solid-state device that can be integrated with microelectronic technology to enable a compact spectrometer-on-a-chip, and with terahertz focal plane array technology to enable a passive, multispectral FIR imaging system.

SUMMARY OF THE INVENTION

The present invention is directed to direct detectors for terahertz radiation. An embodiment of the present invention comprises a FET formed in a semiconductor substrate, the FET having a heterostructure that provides a 2D electron gas in the channel region between the source and the drain of the FET, and a periodic split-grating gate comprising a plurality of fingers on a front surface above the channel region, wherein at least one of the fingers of the grating gate is individually biased, to modulate the electron density in the two-dimensional electron gas; means for applying a gate voltage to the periodic grating gate and an independent gate voltage to the at least one individually biased finger; and means for detecting an output signal from the FET when the front surface is irradiated with terahertz radiation.

Other embodiments are directed to both unsplit- and split-grating-gated FETs. Preferably, the heterostructure of a grating-gated FET comprises one or more QWs. A grating-gated FET can further comprise a transparent front gate and/or a back gate to modify the carrier density in the channel region and improve performance of the detector. A thinned substrate can be used to increase bolometric responsivity. A resistive shunt can be used to connect the fingers of the grating gate in parallel and provide a uniform gate-channel voltage along the length of the channel to increase the responsivity and improve the spectral resolution. A detecting means can comprise measuring a photoconductive or a photovoltaic response to the incident terahertz radiation.

The grating-gated FET shows a tunable resonant plasmon response to terahertz radiation that makes possible an electrically sweepable spectrometer-on-a-chip with no moving mechanical optical parts. Biasing the an individual finger of the split-grating-gated FET to near pinch-off greatly increases the detector's resonant response magnitude over prior DQW FET detectors while maintaining frequency selectivity. The response is large enough and fast enough for the split-grating-gated QW FET to operate as a spectrometer at video refresh rate or faster. Further, the narrow spectral response and signal-to-noise are adequate for use of the QW FET in a passive, multispectral FIR imaging system. A focal plane array of the imaging system could sense different terahertz "colors" by co-locating QW FETs with different grating periods and/or electron densities in single pixels, or a single QW FET could sense different terahertz "colors" by scanning the grating gate voltage.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 2 shows a schematic illustration of the modulation of the electron density under a periodic grating gate. FIG. 2a shows the modulation under a uniform periodic grating gate. FIG. 2b shows the modulation under a split-grating gate.

FIG. 8 shows the source-drain dc current-voltage characteristics (in the dark) of the split-grating-gated QW FET at various values of the bias applied to the finger gate. Points A, B, C, and D indicate dc bias operating points for the optical response measurements shown in FIG. 9a.

DETAILED DESCRIPTION OF THE INVENTION

An embodiment of the direct detector of the present invention uses a heterostructure FET, similar to that of Peralta et al., but uses a split-grating gate designed to incorporate both the tunability offered by the grating gate and the enhanced responsivity seen in near-pinch-off operation. The split-grating gate concept is illustrated in FIG. 2b. The periodic grating gate 24 spatially modulates the electron density in the channel. A finger 26 of the split-grating gate can be individually biased to locally pinch off the channel, thereby making the device sensitive to temperature changes induced by resonantly absorbed terahertz radiation.

Figure 1:
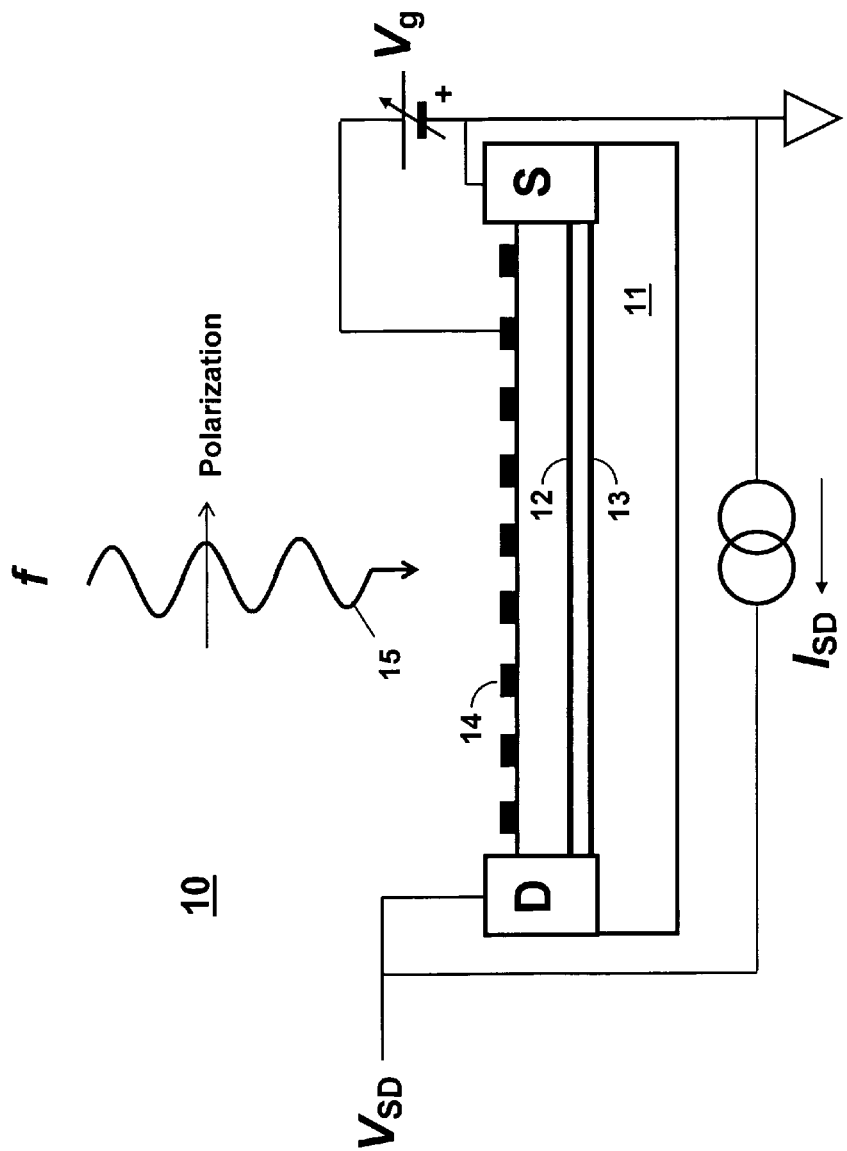
FIG. 1 shows a schematic side view illustration of a prior DQW FET with a periodic grating gate.
Figure 3:
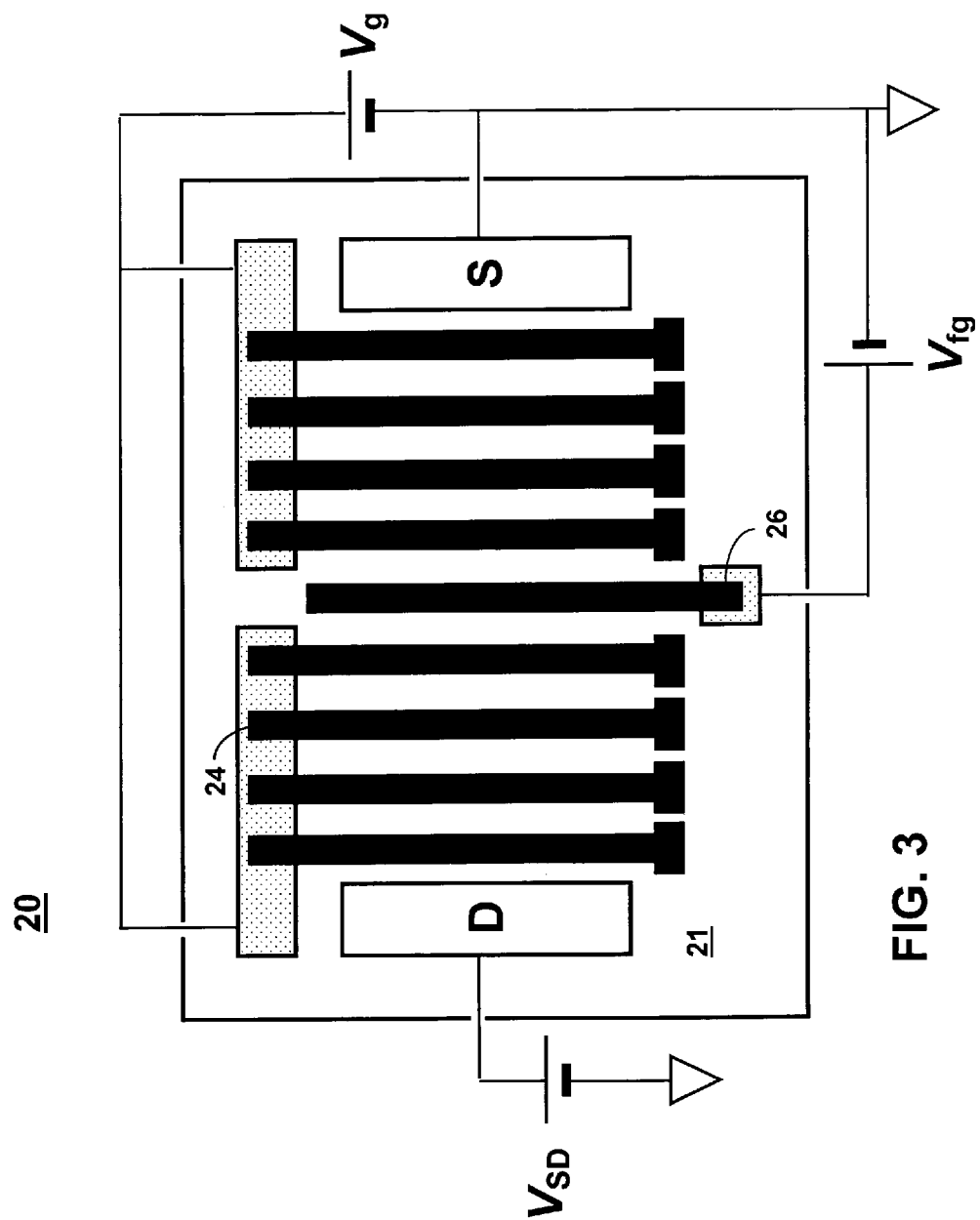
FIG. 3 shows a schematic top view illustration of a QW FET with a split-grating gate.
Figure 4:
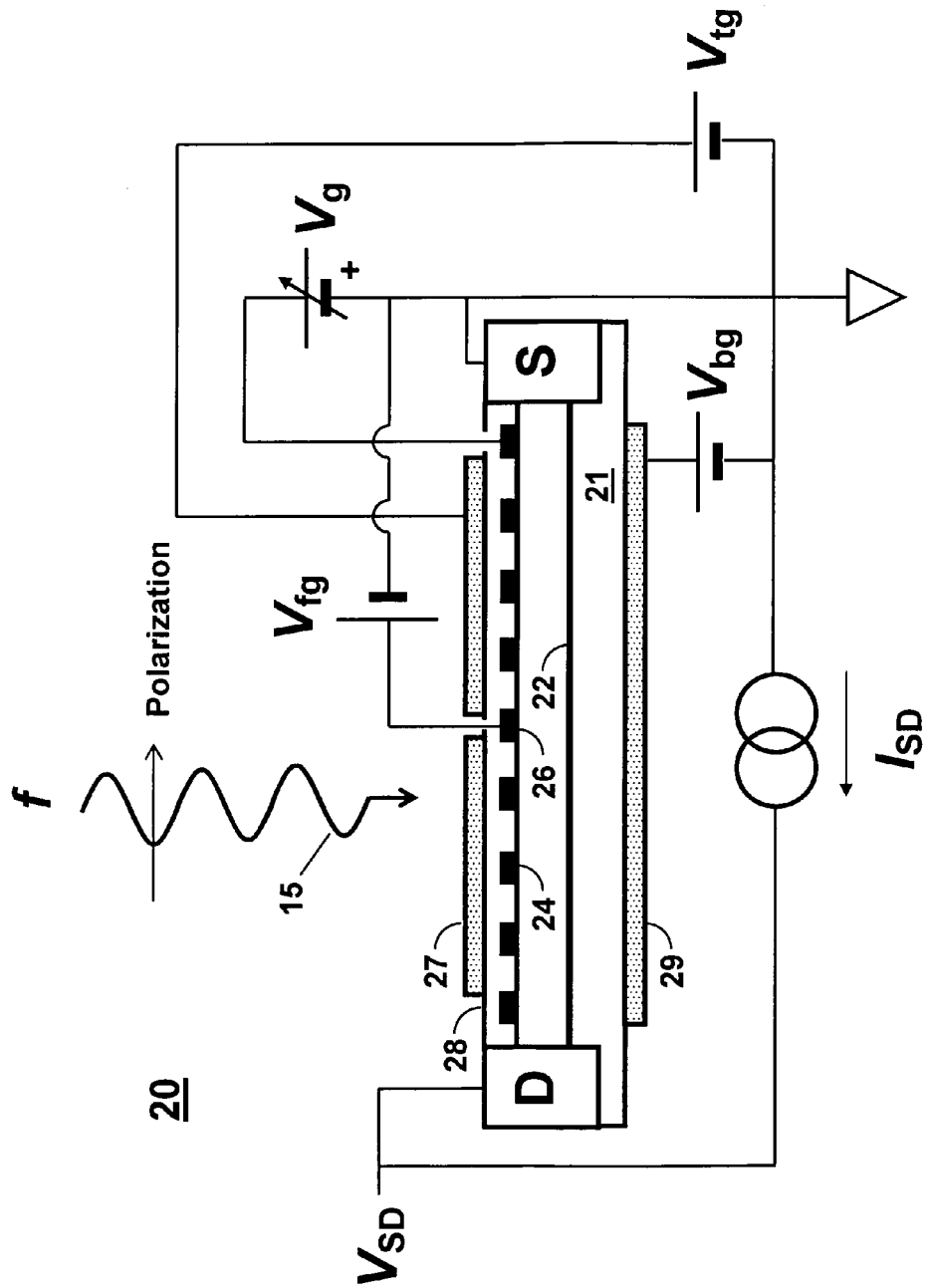
FIG. 4 shows a schematic side view illustration of the QW FET with a split-grating gate, a transparent front gate, and an independent back gate.

In FIG. 3 is shown a schematic top view illustration of a split-grating-gated FET direct detector 20, comprising a grating gate 24 that is split by an individually biased finger 26. In FIG. 4 is shown a schematic side view illustration of the split-grating-gated detector 20. The detector 20 has a surface metal gate 24 used to control the charge density in the underlying heterostructure 22 of the FET. The gate is patterned into a periodic grating 24 that induces a spatial charge density periodicity in the heterostructure 22. The gate grating 24 acts as an antenna having a broad incident beam area and narrow frequency bandwidth. The spatial charge density in the heterostructure 22 promotes coupling to certain wavelengths of incident electromagnetic radiation 15 that is polarized perpendicular to the grating lines. The split-grating gate 24 can be biased at a grating gate voltage $V_g$ and the finger 26 can be biased at an individual gate voltage $V_{fg}$ to locally pinch off the channel. In the pinch-off portion, the carrier density is reduced (by using a large negative gate bias) to near pinch-off conditions, thus increasing the temperature coefficient of the device resistance $dR_{SD}/dT$. Although the finger 26 is shown splitting the grating gate symmetrically in FIGS. 3 and 4, the finger 26 can split the grating gate asymmetrically, or be at either end of the grating gate 24.

In a photoconductive detection mode (as shown), the drain-source can be dc biased by a current source to provide a constant drain-source bias current $I_{SD}$ (e.g., 10-100 µA). The incident radiation at the plasmon resonance produces a photovoltage, $V_{SD}$, leading to a change in the electrical resistance of the channel.

The detector can alternatively be operated in a photovoltaic detection mode (i.e., no applied source-drain voltage). In the photovoltaic mode, a forward voltage will appear across the drain-source when the channel region is illuminated by the incident radiation at the plasmon resonance. Therefore, the photovoltaic mode enables lower power operation of the device, because no constant bias current is applied while the device is in the quiescent state. Such a photovoltaic detector could reduce the dissipated chip power, advantageous for imaging array applications.

The high electron mobility heterostructure 22 underlying the grating gate provides a gatable 2DEG in the channel region between the source S and the drain D of the FET. The heterostructure 22 comprises dissimilar compound semiconductors, such as III-V or II-VI compound semiconductors, or Ge—Si alloys, formed in a semiconductor substrate 21. Preferably, the heterostructure 22 comprises one, or more than one, closely spaced high electron mobility QW layers. The high electron mobility QW can be a thin layer of a high purity compound semiconductor that is modulation doped by surrounding, wider band gap doped barriers. For example, the QW can be an undoped GaAs layer sandwiched between donor-doped AlGaAs barriers. Electrons from the doped AlGaAs barrier fall into the high mobility GaAs well and become trapped there, providing the 2DEG.

The DQW FET of Peralta et al. comprised a III-V double QW heterostructure. It was speculated that the double QW was needed to achieve tunability. However, it has recently been shown that similar continuous tunability can be obtained in a single QW FET. Single well devices have several advantages compared to double well structures, such as low biasing requirements and easier fabrication of other on-chip electronics for amplification. Further, the single QW FET displays enhanced photovoltaic behavior, enabling a detector which can operate without a bias current. See E. A. Shaner et al., "Single-quantum-well grating-gated terahertz plasmon detectors," *Appl. Phys. Lett.* 87, 193507 (2005), which is incorporated herein by reference.

The sensitivity to a specific terahertz frequency can be electrically and continuously tuned over a broad frequency range of roughly a hundred GHz. The range of frequencies is dependent on both the nominal electron density of the 2DEG and the grating period. The electron density can be modified by changing the modulation doping of the heterostructure. Higher doping and small grating periods (e.g., 1 μm) provide higher operating frequencies (e.g., in excess of a terahertz). Lower doping and longer grating periods provide lower operating frequencies (e.g., 100 GHz or less). The electrical tunability acts as a built-in filter that rejects out-of-band noise and interference.

As shown in FIG. 4, alternative gate designs can also be used to modify the electron density and improve the performance of an unsplit- or a split-grating-gated FET 20. For example, a transparent uniform gate 27 can be formed on the front surface and separated from the grating gate 24 by an insulating layer 28. The transparent gate 27 can comprise a thin layer of a material (e.g., less than 10 nm thickness of titanium or tantalum nitride) that is conductive and transparent to the incident terahertz radiation in the frequency range of interest. A gate voltage $V_{fg}$ can be applied to the transparent front gate 27 to independently control the electron density between the grating fingers. Alternatively, a back gate 29 can be provided on the back surface of the substrate (preferably, a thinned wafer) opposite the grating gate 24. The back gate 29 can be independently controlled via a back gate voltage $V_{bg}$. The front and back gate controls are not limited to depletion under the grating fingers and can therefore provide much larger variation in the carrier densities in the channel region. For example, the front and back gates 27 and 29 can be used to reduce the average density in the 2DEG and tune the plasmon frequency between the fingers to enhance the photoresponse.

The responsivity of the direct detector is dependent on the applied bias current. Increasing the current bias increases the responsivity. However, increasing the current also raises the drain voltage and the variation in the gate-channel voltage along the length of the channel. The local gate-channel voltage determines the local electron density in the channel. Therefore, this variation in the gate-channel voltage changes the absorption frequency along the length of the channel, increasing the absorption linewidth of the device. To increase the responsivity (by increasing the current) and to minimize the absorption linewidth (i.e., improve the spectral resolution), the gate-channel voltage needs to be uniform along the length of the channel.

Figure 5:
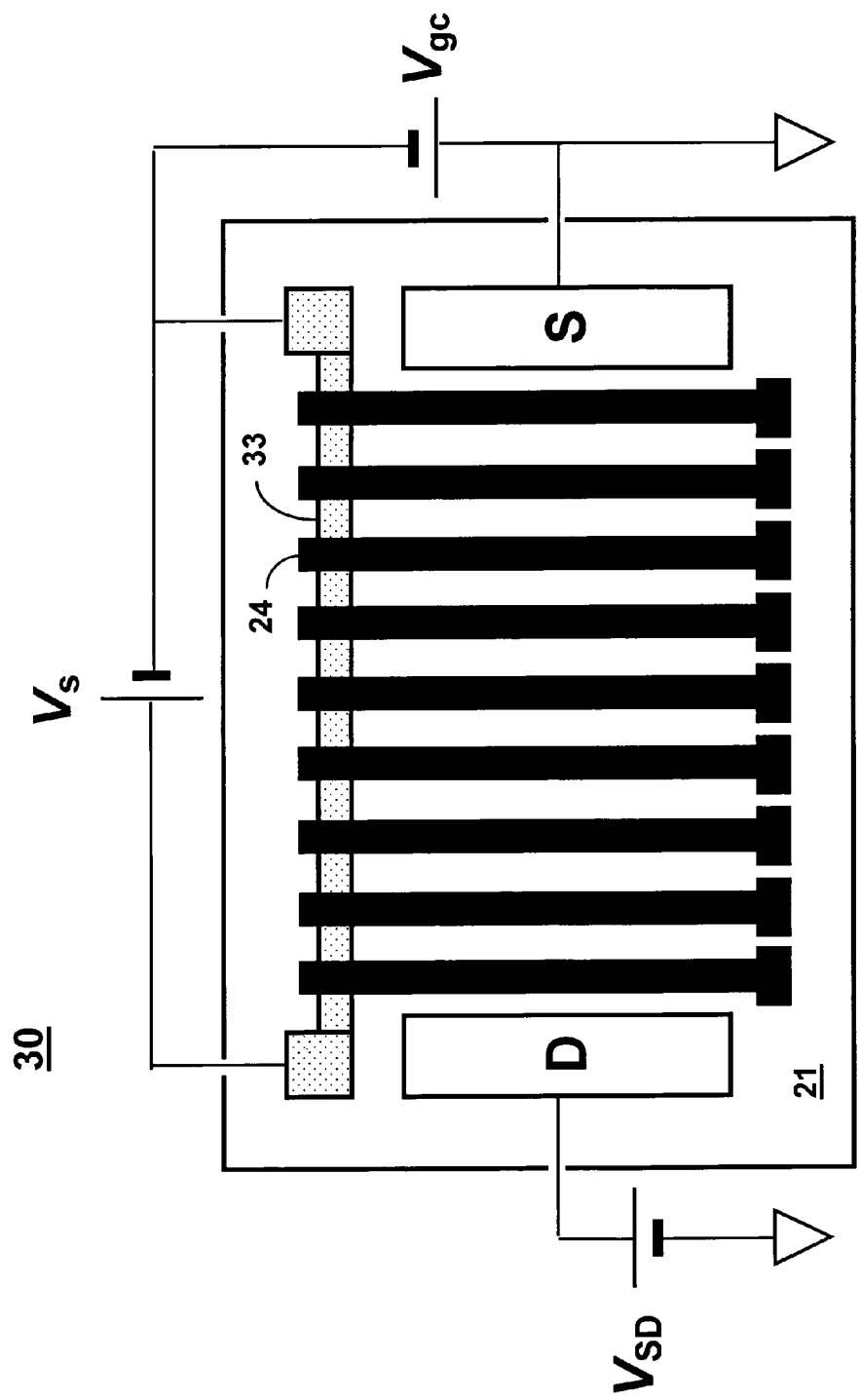
FIG. 5 shows a schematic top view illustration of a direct detector, comprising a shunt resistor that connects the fingers of a grating-gated FET in parallel.

As shown in FIG. 5, the gate-channel voltage variation of a split- or an unsplit-grating-gated FET 30 can be reduced or eliminated by connecting the fingers of the grating gate 24 in parallel with a resistive shunt 33. A shunt voltage $V_s$ approximately equal to the source-drain voltage $V_{SD}$ can be applied to drive a small current through the resistive shunt 33. To minimize power consumption, the shunt 33 can be a high resistivity material, such as nichrome. High resistance also minimizes the chance that the shunt 33 can act as an antenna for the incoming radiation 15, that could also affect the gate-channel voltages. With the resistive shunt 33, the voltage difference between adjacent grating fingers 24 is equal to the voltage drop in the 2DEG per each period of the grating, thereby keeping the gate-channel voltage $V_{gc}$ constant for each grating finger. The absorption linewidth can thereby be narrowed to the intrinsic plasmon linewidth and the responsivity can be increased by operating the FET at higher currents.

A conventional, 0.5-mm-thick substrate has very high thermal conductance and the resonantly absorbed energy is rapidly dissipated in the substrate, leading to only a small temperature rise. The responsivity of the detector can be increased by reducing the heat capacity of the bolometric element and/or thermally isolating the element from its environment. In this way, the thermal time constant becomes slow compared to the intrinsic device speed. Further, it takes a less power to achieve the same temperature rise in the element. The increased thermal isolation will also slow the response time of the detector. Therefore, the substrate can be thinned (e.g., to less than 10 microns) under the channel region, lowering the heat capacity, and the thinned substrate can be suspended by legs from the unthinned portion of the substrate to mitigate the large thermal conductance of the substrate, thereby increasing the bolometric responsivity. Alternatively, a thermally insulating layer can be placed between the thin active element and the bulk substrate for thermal isolation.

Figure 6:
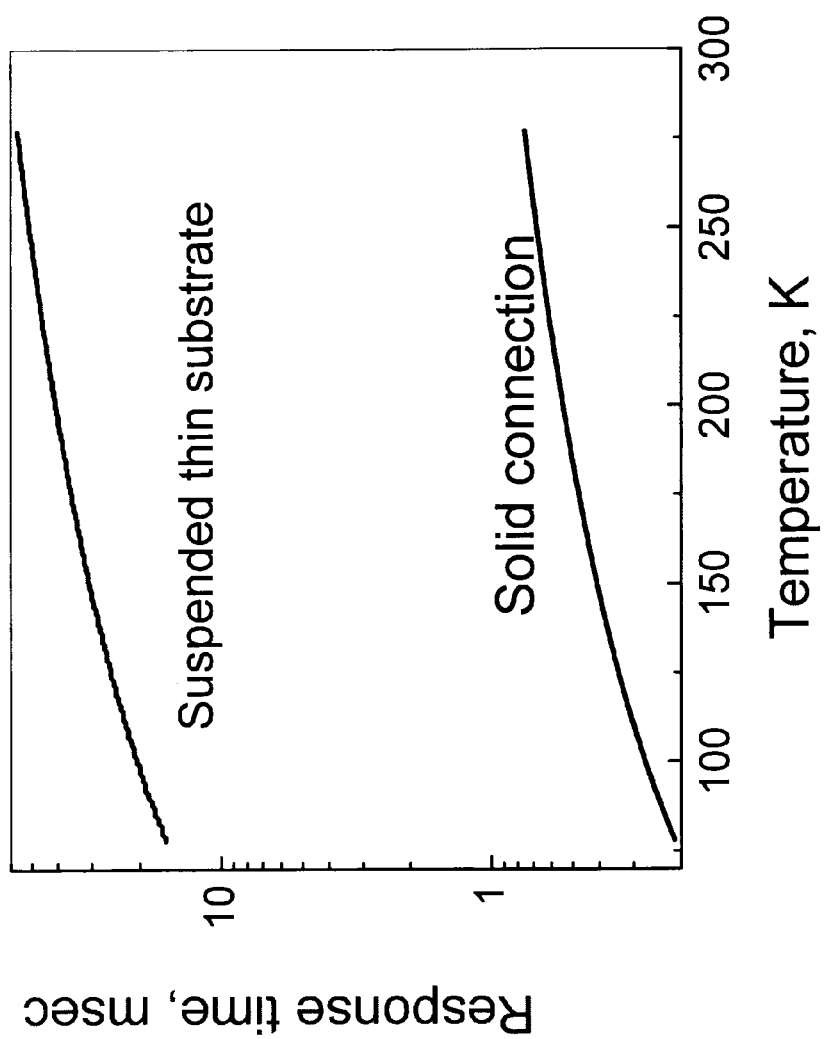
FIG. 6 shows a graph of the calculated response time versus temperature for a thinned/suspended detector element and for a detector fabricated in a conventional, thick substrate.
Figure 7:
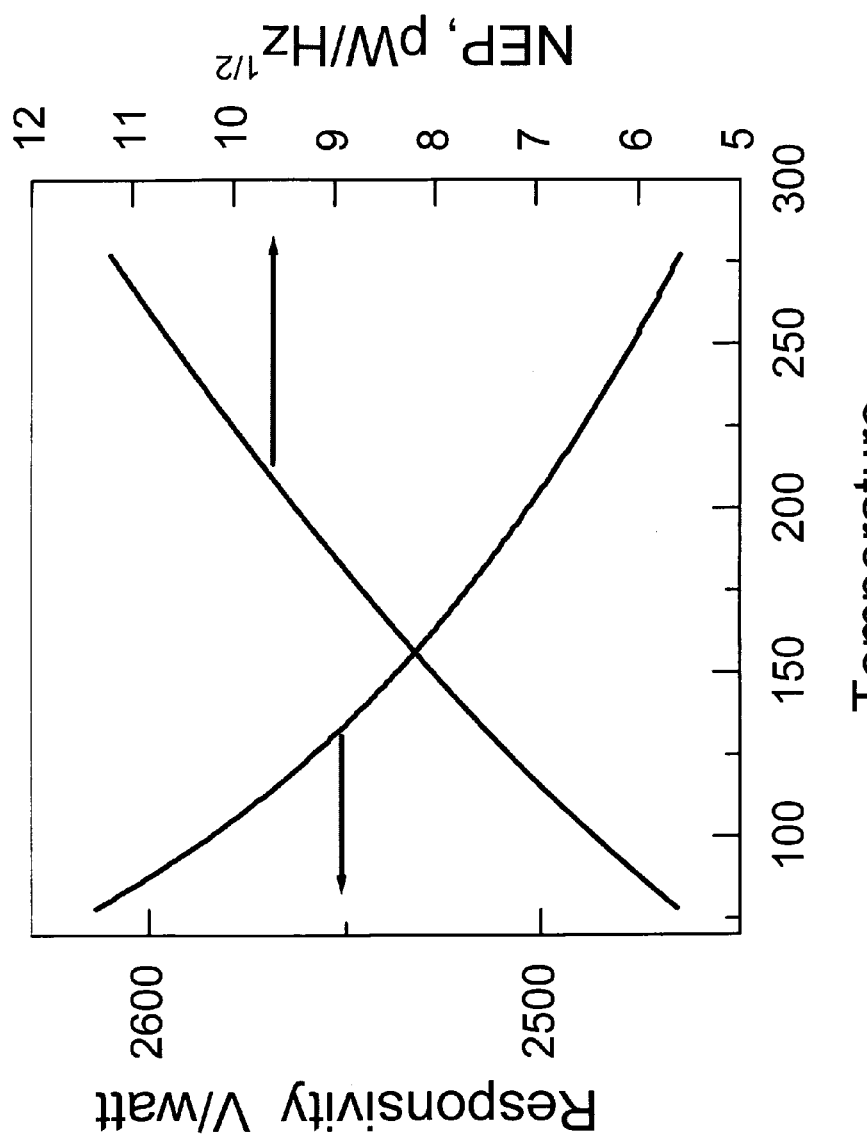
FIG. 7 shows a graph of the calculated responsivity and NEP versus temperature for the thinned detector.

In FIG. 6 is shown the calculated response time versus temperature for an unsplit-grating-gated QW FET fabricated in a 4.5-μm-thick substrate suspended by eight 1-mm-long legs (labeled "suspended thin substrate") and a similar detector fabricated in a conventional, thick substrate (labeled "solid connection"). The calculated time constant is 10's of milliseconds for the thinned detector. This time constant is compatible with a focal plane array frame rate of about 30 per second. In FIG. 7 is shown the calculated responsivity and the NEP for the thinned detector (assuming Johnson noise). The responsivity is of order 2000 V/W and NEP is of order $10^{-11}$ W/Hz$^{1/2}$. This is equivalent to an image noise equivalent temperature difference at 1 THz of about 3° K/Hz$^{1/2}$.

Experimental Results for a Split-Grating-Gated QW FET

The operating characteristics of a split-grating-gated QW FET of the type shown in FIG. 3 was examined. The grating gate comprised 2 μm metal fingers separated by 2 μm gaps, providing a grating gate period of d=4 μm. The grating gate was split into separate source-side and drain-side halves. Between these halves was an independent single finger gate 2 μm wide. Single QW GaAs—AlGaAs heterostructures were used. These were grown by molecular beam epitaxy and consisted of a single modulation-doped GaAs well, 40 nm wide, formed 200 nm below the wafer surface. The QW had electron density of 2.5×10$^{11}$ cm$^{-2}$ and mobility μ≈5×10$^6$ cm$^2$/V·s at 4° K. The device was fabricated on an isolation mesa etched completely though the QW layer. Standard annealed ohmic contacts formed the source and drain. The gate metallization comprised 20 nm Ti and 50 nm Au. Gate grating areas from 2 mm×2 mm down to 0.2 mm×0.2 mm were fabricated, with no significant performance or response difference.

Figure 8:
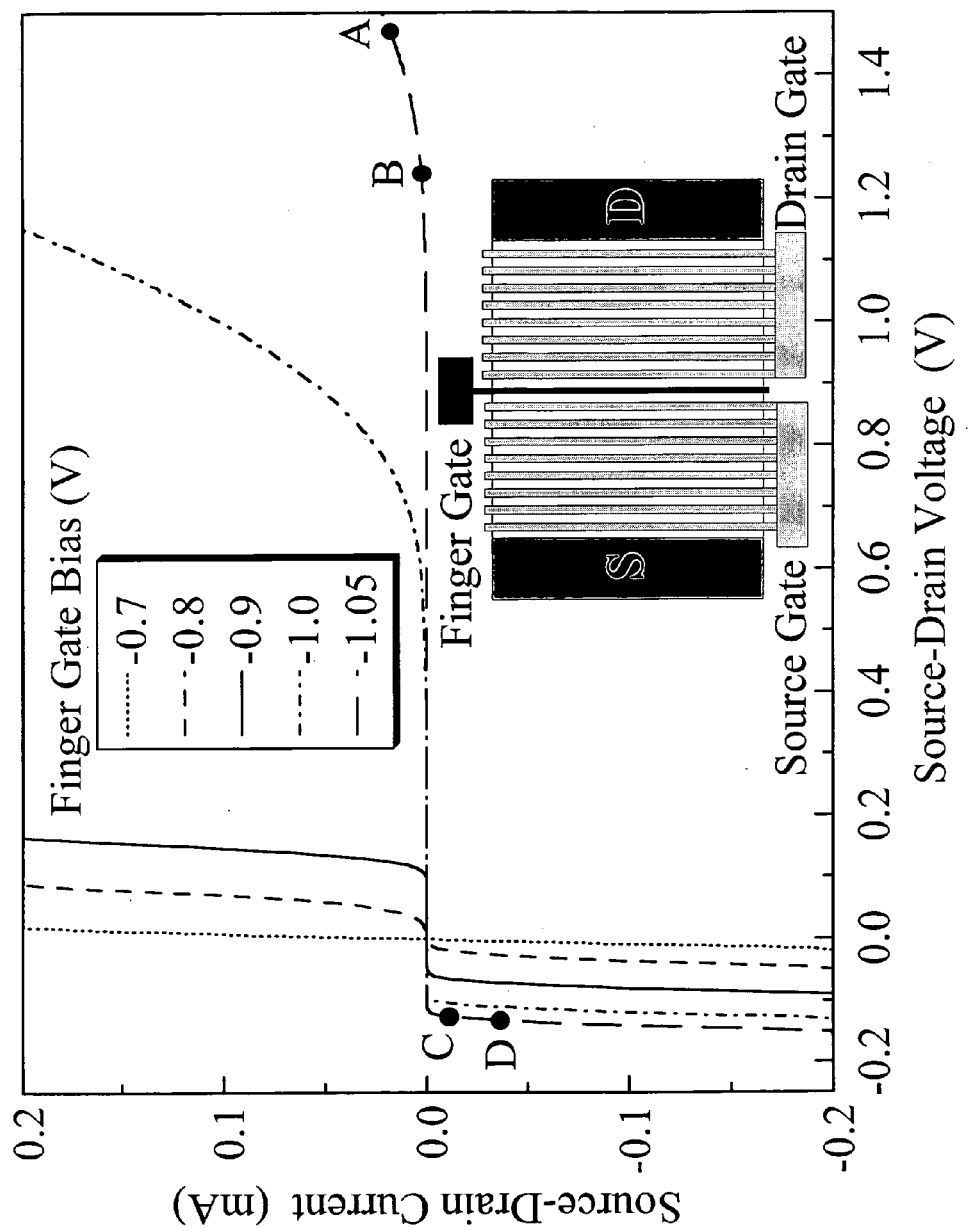

In FIG. 8 is shown a graph showing the source-drain current-voltage ($I_{SD}$-$V_{SD}$) characteristics of the QW FET at various finger gate biases $V_{fg}$. The source and drain gates were shorted to the source and drain contacts, respectively. The pinch-off voltage for this structure was $V_0$≈−0.75 V. When $V_{fg}$>>$V_0$ in the bulk channel, $I_{SD}$-$V_{SD}$ is linear and between 10 to 100Ω. As $V_{fg}$ is biased below $V_0$, the 2 μm stripe down the center of the channel gets pinched off and $I_{SD}$-$V_{SD}$ takes on diode-like nonlinear characteristics that are strongly dependent on $V_{fg}$. This behavior is consistent with tunneling through a potential barrier beneath the single finger gate whose barrier height depends on $V_{fg}$.

Optical response was measured with a $CO_2$-pumped molecular gas FIR laser using the rotational lines of formic acid vapor. The FIR light was focused via various optics and split by a Mylar beamsplitter to both the QW FET and an uncalibrated pyroelectric power monitor. The light was chopped mechanically at 385 Hz and detected signals measured using lock-in techniques. The QW FET was in a continuous-flow helium cryostat and maintained at 20° K temperature.

Figures 9A, 9B:
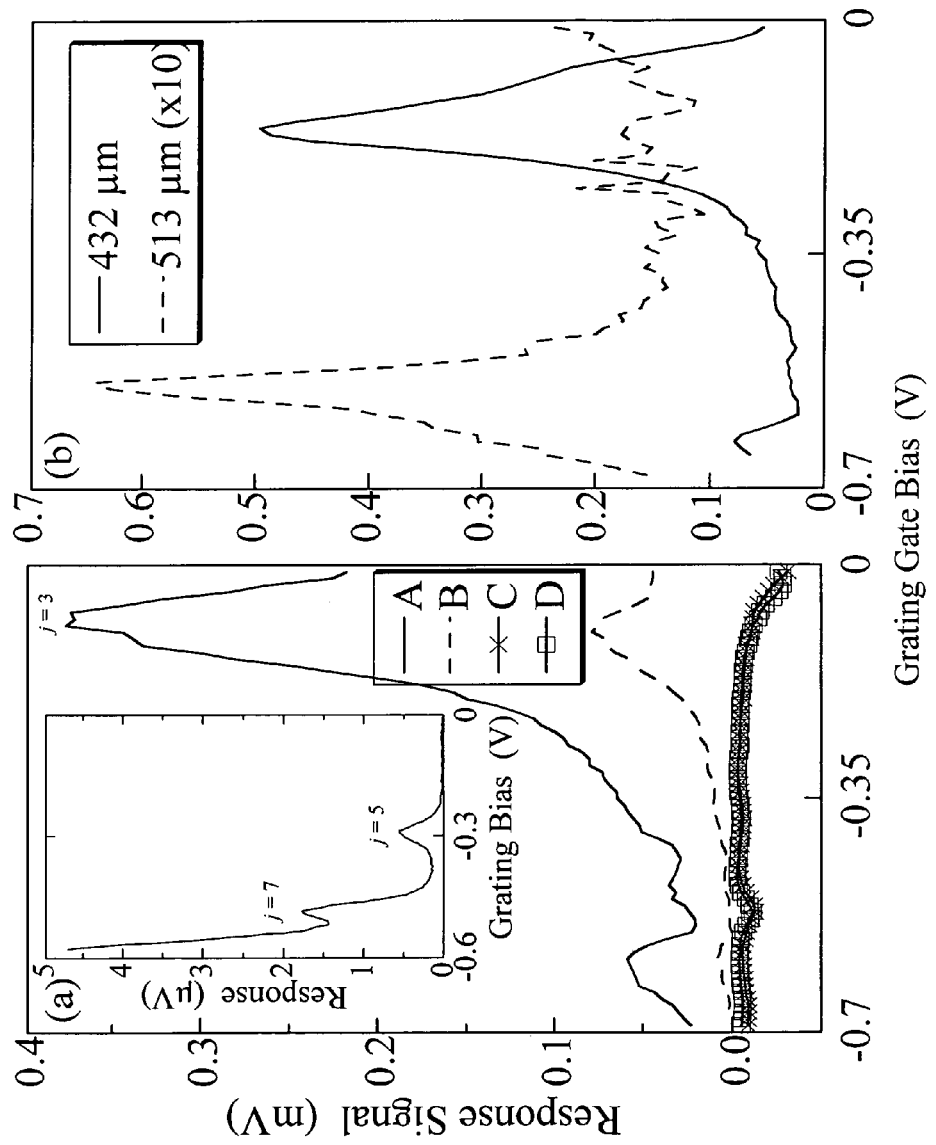
FIG. 9a shows the optical response of the QW FET to 393 µm illumination as a function of grating gate bias for both unsplit- and split-grating gates. The inset shows the response in unsplit-gate mode. The main figure shows operation in split-gate mode with the split-finger bias set at −1.05 V. The curves A, B, C, and D correspond to the source-drain dc operating biases shown in FIG. 8.
FIG. 9b shows the optical response of the QW FET in the split-grating-gate mode to 432 µm and 513 µm irradiation.

The inset in FIG. 9(a) shows the QW FET response to 393 µm radiation as a function of gate bias with all three gates tied to one voltage source. This unsplit-gate configuration is identical to the prior periodic grating gate design of Peralta et al. and generates the same results: a resonant plasmon peak is seen at $V_g=\sim-0.29$ V and a harmonic at $-0.48$ V, with a steep response rise at more negative $V_g$. The signal magnitude is 0.5 µV and 1.8 µV on the plasmon peaks, rising to 5 pV at $V_g=-0.6$ V.

In FIG. 9(a) is shown the QW FET response for identical experimental conditions, except that the detector was operated in split-gate mode with the single finger gate biased separately from the source- and drain-side grating gates. $V_{fg}$ is referred to the drain contact. The source-side gate bias is referred to the source contact, and the drain-side gate bias is referred to the drain. These two grating gate biases are maintained equal to each other by the bias circuitry. The source-drain dc bias is referred to the drain, which is the device common. $V_{fg}=-1.05$ V for all traces. A, B, C, D corresponding to the labeled source-drain dc bias operating points in FIG. 8.

The magnitude of the resonance at $-0.08$ V and its harmonic at $-0.6$ V in curve A are approximately 200 and 60 times larger, respectively, than the bigger of the two resonances in the uniform-gate configuration at the same illumination power. Such a dramatic increase in response was observed only with $V_{fg}$ biased well beyond the nominal bulk $V_0$. Biasing the detector to points C and D in FIG. 8, where the I-V characteristics are more strongly nonlinear than at point A, did not generate nearly as large a resonant plasmon response, counter to the behavior for diode-like detectors.

In FIG. 9(b) is shown the optical response of the split-gate detector at 432 µm and 513 µm. Laser output power at 513 µm, as monitored by the pyroelectric, was about 8 times smaller compared to 432 µm. Therefore, the 513 µm response data was expanded by 10, as plotted. For a fixed gate grating period and the same harmonic index, going to longer plasmon resonance wavelength requires reducing the charge density. As indicated in FIG. 9(b), this is accomplished by applying more negative gate biases. Response amplitude in the split-gate mode was always of order $10^2$ larger than in the unsplit-gate mode.

Figure 10:
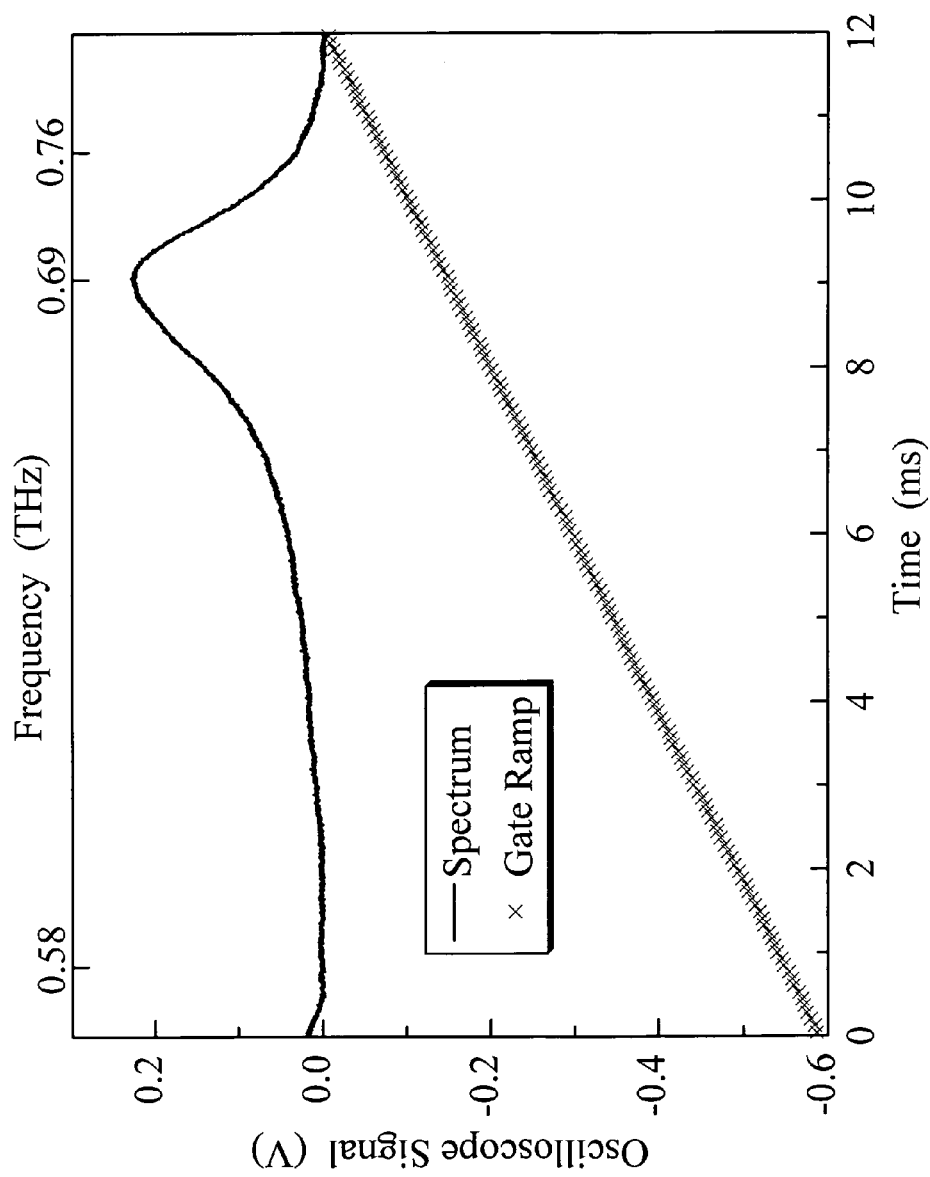
FIG. 10 shows the swept output signal of the split-grating-gated QW FET run as a FIR spectrometer.

In split-gate operation of the QW FET, the plasmon response is sufficiently large and the parasitic reactance sufficiently small that the detector can be run as a swept spectrometer with trace acquisition time compatible with the video refresh rates. This is shown in FIG. 10, where the QW FET response to 432 µm was taken on a digital oscilloscope. Here $V_{fg}=-1.05$ V and the grating gates ramped from $-0.6$ V to 0.0 V with a 40 Hz triangle wave. Laser output power was 4 mW in this measurement, but the power incident on and absorbed by the QW FET could not be determined reliably. The response signal was put through a 20× gain pre-amp and into the scope. Because the QW FET's source-drain conductance depends on gate bias, a "dark" trace of the QW FET vs. gate bias ramp in the absence of FIR illumination was taken and stored in scope memory. The scope was set to display the difference between the trace collected under FIR illumination and the stored dark trace.

The 432 µm resonance peak is clearly seen as the gate bias crosses $-0.16$ V in a single full-scale ramp. The signal-to-noise ratio is near 20 dB, limited primarily by the oscilloscope input noise. The spectral coverage of this single QW FET with this doping level and gate grating period is at least 520 µm to 390 µm, or approximately 570 to 770 GHz.

The present invention has been described as direct detector for terahertz radiation. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A direct detector for terahertz radiation, comprising:
   a field-effect transistor formed in a semiconductor substrate, comprising a heterostructure that provides a two-dimensional electron gas in the channel region between the source and the drain of the field-effect transistor, and a periodic split-grating gate comprising a plurality of fingers on a front surface above the channel region, wherein at least one of the fingers of the grating gate is individually biased, to modulate the electron density in the two-dimensional electron gas;
   means for applying a gate voltage to the periodic grating gate and a independent gate voltage to the at least one individually biased finger; and
   means for detecting an output signal from the field-effect transistor when the front surface is irradiated with terahertz radiation.

2. The direct detector of claim 1, wherein the at least one individually biased finger is biased to near the pinch-off voltage of the channel.

3. The direct detector of claim 1, wherein the heterostructure comprises one or more quantum wells.

4. The direct detector of claim 3, wherein the heterostructure comprises a single quantum well.

5. The direct detector of claim 1, wherein the heterostructure comprises dissimilar II-V compound semiconductors, II-VI compound semiconductors, or Ge—Si alloys.

6. The direct detector of claim 5, wherein the dissimilar III-V compound semiconductors comprise GaAs and AlGaAs.

7. The direct detector of claim 1, wherein the terahertz radiation has a frequency of greater than 100 GHz.

8. The direct detector of claim 1, wherein the detecting means comprises measuring the photoconductive response of the field-effect transistor.

9. The direct detector of claim 1, wherein the detecting means comprises measuring the photovoltaic response of the field-effect transistor.

10. The direct detector of claim 1, further comprising a back gate on the opposite side of the channel region from the grating gate.

11. The direct detector of claim 1, further comprising a transparent front gate on the front surface above the channel region.

12. The direct detector of claim 1, wherein the substrate comprises a thinned substrate.

13. The direct detector of claim 1, further comprising a resistive shunt that connects the fingers of the grating gate in parallel and means for applying a shunt voltage to the resistive shunt.

14. The direct detector of claim 13, wherein the shunt voltage is approximately equal to the source-drain voltage.

15. A direct detector for terahertz radiation, comprising:
   a field-effect transistor formed in a semiconductor substrate, comprising a single quantum well that provides a two-dimensional electron gas in the channel region between the source and the drain of the field-effect transistor, and a periodic grating gate comprising a plurality of fingers on a front surface above the channel region to modulate the electron density in the two-dimensional electron gas;

means for applying a gate voltage to the periodic grating gate; and means for detecting an output signal from the field-effect transistor when the front surface is irradiated with terahertz radiation.

16. The direct detector of claim 15, wherein the single quantum well comprises dissimilar II-V compound semiconductors, II-VI compound semiconductors, or Ge—Si alloys.

17. The direct detector of claim 16, wherein the dissimilar III-V compound semiconductors comprise GaAs and AlGaAs.

18. The direct detector of claim 16, wherein the detecting means comprises measuring the photoconductive response of the field-effect transistor.

19. The direct detector of claim 16, wherein the detecting means comprises measuring the photovoltaic response of the field-effect transistor.

20. The direct detector of claim 16, further comprising a back gate on the opposite side of the channel region from the grating gate.

21. The direct detector of claim 16, further comprising a transparent front gate on the front surface above the channel region.

22. The direct detector of claim 16, wherein the substrate comprises a thinned substrate.

23. The direct detector of claim 16, further comprising a resistive shunt that connects the fingers of the grating gate in parallel and means for applying a shunt voltage to the resistive shunt.

24. A direct detector for terahertz radiation, comprising:
a field-effect transistor formed in a semiconductor substrate, comprising a heterostructure that provides a two-dimensional electron gas in the channel region between the source and the drain of the field-effect transistor, and a periodic grating gate comprising a plurality of fingers on a front surface above the channel region to modulate the electron density in the two-dimensional electron gas;
a resistive shunt that connects the fingers of the grating gate in parallel;
means for applying a shunt voltage to the resistive shunt; and
means for detecting an output signal from the field-effect transistor when the front surface is irradiated with terahertz radiation.

25. The direct detector of claim 24, wherein the shunt voltage is approximately equal to the source-drain voltage.

26. The direct detector of claim 24, wherein the heterostructure comprises one or more quantum wells.

27. The direct detector of claim 24, wherein the detecting means comprises measuring the photoconductive response of the field-effect transistor.

28. The direct detector of claim 24, wherein the detecting means comprises measuring the photovoltaic response of the field-effect transistor.

29. The direct detector of claim 24, further comprising a back gate on the opposite side of the channel region from the grating gate.

30. The direct detector of claim 24, further comprising a transparent front gate on the front surface above the channel region.

31. The direct detector of claim 24, wherein the substrate comprises a thinned substrate.

32. A direct detector for terahertz radiation, comprising:
a field-effect transistor formed in a semiconductor substrate, comprising a heterostructure that provides a two-dimensional electron gas in the channel region between the source and the drain of the field-effect transistor, and a periodic grating gate comprising a plurality of fingers on a front surface above the channel region to modulate the electron density in the two-dimensional electron gas;
means for applying a gate voltage to the periodic grating gate; and
means for detecting a photovoltaic response of the field-effect transistor when the front surface is irradiated with terahertz radiation.

33. The direct detector of claim 32, wherein the heterostructure comprises one or more quantum wells.

34. The direct detector of claim 33, wherein the heterostructure comprises a single quantum well.

35. The direct detector of claim 31, further comprising a back gate on the opposite side of the channel region from the grating gate.

36. The direct detector of claim 31, further comprising a transparent front gate on the front surface above the channel region.

37. The direct detector of claim 31, wherein the substrate comprises a thinned substrate.

38. A direct detector for terahertz radiation, comprising:
a field-effect transistor formed in a thin semiconductor substrate, comprising a heterostructure that provides a two-dimensional electron gas in the channel region between the source and the drain of the field-effect transistor, and a periodic grating gate comprising a plurality of fingers on a front surface above the channel region to modulate the electron density in the two-dimensional electron gas;
means for applying a gate voltage to the periodic grating gate; and
means for detecting an output signal from the field-effect transistor when the front surface is irradiated with terahertz radiation.

39. The direct detector of claim 38, wherein the thickness of the substrate is less than 10 microns.

40. The direct detector of claim 38, wherein the thin semiconductor substrate is suspended by a plurality of legs from an unthinned portion of the substrate.

* * * * *